United States Patent [19]

Roberts et al.

[11] Patent Number: 4,559,549

[45] Date of Patent: Dec. 17, 1985

[54] DATA STORAGE DEVICES WITH VERTICAL CHARGE TRANSFER

[75] Inventors: Derek H. Roberts, Buckingham; Michael Pepper, Cambridge, both of England

[73] Assignee: The General Electric Company, p.l.c., England

[21] Appl. No.: 409,128

[22] Filed: Aug. 18, 1982

[30] Foreign Application Priority Data

Aug. 21, 1981 [GB] United Kingdom ................. 8125615
Jul. 26, 1982 [GB] United Kingdom ................. 8221791

[51] Int. Cl.$^4$ ............................................. H01L 29/78
[52] U.S. Cl. ........................................ 357/24; 357/49; 357/12; 357/54; 357/50; 357/56
[58] Field of Search ............... 357/49, 45, 12, 13, 357/23.5, 24 R, 24 M, 54, 50, 55, 56

[56] References Cited

U.S. PATENT DOCUMENTS

| | | |
|---|---|---|
| 3,744,036 | 7/1973 | Frohman-Bentchkowsky ............... 357/23.5 X |
| 3,966,577 | 8/1976 | Hochberg ........................ 357/49 X |
| 4,079,358 | 3/1978 | Arntz ............................. 357/23.5 X |
| 4,087,795 | 5/1978 | Rossler ........................... 357/54 X |
| 4,144,588 | 3/1979 | Goettler et al. .................. 357/24 X |
| 4,211,582 | 7/1980 | Horng et al. ..................... 357/49 X |
| 4,257,056 | 3/1981 | Shum .............................. 357/54 X |
| 4,285,000 | 8/1981 | Deyhimy et al. ................... 357/24 |
| 4,377,818 | 3/1983 | Kuo et al. ........................ 357/23.5 |
| 4,385,308 | 5/1983 | Uchida ............................ 357/23.5 X |
| 4,443,064 | 4/1984 | Grinberg et al. .................. 357/24 X |

Primary Examiner—Andrew J. James
Assistant Examiner—William A. Mintel
Attorney, Agent, or Firm—Kirschstein, Kirschstein, Ottinger & Israel

[57] ABSTRACT

A data storage device comprising a planar integrated circuit (13) formed on a face of a body of an electronic storage material which provides a plurality of spaced discrete columns of spaced discrete electric charge storage sites (5), the columns extending in directions normal to the plane of the intergrated circuit and the integrated circuit providing access to the storage sites.

4 Claims, 6 Drawing Figures

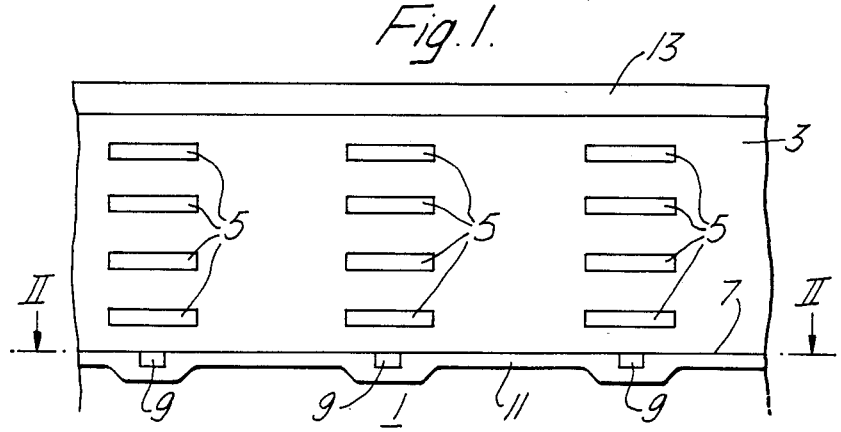
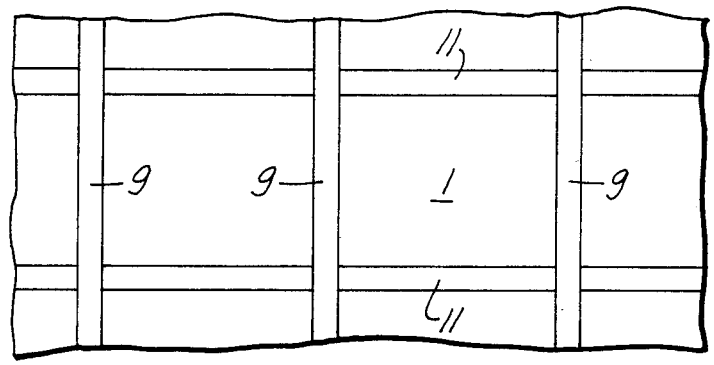
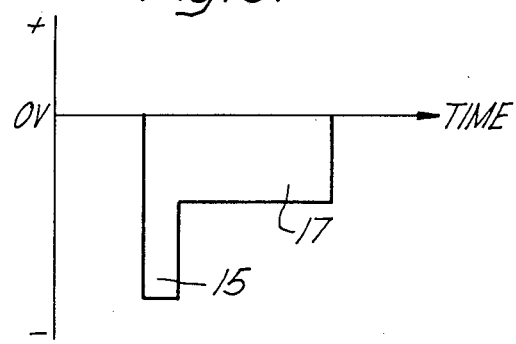

DATA STORAGE DEVICES WITH VERTICAL CHARGE TRANSFER

This invention relates to data storage devices and more particularly to such devices utilising semiconductor integrated circuit technology.

Such devices which are at present commerically available comprise a planar integrated circuit different parts of which perform two quite distinct functions, namely storage of data and provision of access to the data storage part of the circuit i.e. for read, write and/or erase purposes. However, each individual transistor or other active element of a planar integrated circuit is only able to store a single bit of data and, although high packing densities have been achieved, the amount of data which can be stored in an integrated circuit is in practice quite limited.

It is an object of the present invention to provide a data storage device utilising semiconductor integrated circuit technology wherein this problem is overcome.

According to the invention a data storage device comprises a planar integrated circuit formed on a face of a body of an electronic storage material, the storage material providing a plurality of spaced discrete columns of spaced discrete electric charge storage sites, the columns extending in directions normal to the plane of the integrated circuit and the integrated circuit providing access to the storage sites.

Preferably the integrated circuit means is associated with control means on the side of said body remote from the integrated circuit whereby, under control of the integrated circuit, electric charge may be injected into a storage site adjacent said control means in a selected said column, and whereby the charges in a selected column may each be transferred to the next adjacent site in that column in a direction towards the integrated circuit.

In such an arrangement each column of storage sites in the storage material will normally be associated with respective element of the integrated circuit into which a charge in the adjacent site of the associated column of sites may be transferred by operation of said control means.

In one particular embodiment of the invention said body of storage material consists of semiconductor mateiral, each storage site consisting of a material of relatively low dielectric constant compared with the material separating said sites.

In one such embodiment the storage sites consist of silicon and the material separating the sites consists of silicon oxide, which may be doped with suitable impurities to increase charge mobility.

In such an arrangement injection of charge is suitably effected by an avalanche breakdown mechanism, and transfer of charge from storage site to storage site is suitably effected by a tunnelling and transport mechanism. The transport mechanism may, if desired, be photon assisted.

In such an arrangement the control means suitably comprises a p-n junction adjacent the appropriate end of each column of storage sites. Charge injection may then be effected by applying an appropriately high reverse bias across the relevent p-n junction, and charge transfer by applying an appropriate potential between an electrode of the revelant p-n junction and the intergrated circuit substrate.

One data storage device in accordance with the invention will now be described, by way of example, with reference to the accompanying drawings in which:

FIG. 1 is a diagrammatic sectional view of part of the device;

FIG. 2 is a view on the line II—II in FIG. 1;

FIG. 3 illustrates the waveform of a voltage applied to the device in operation;

Figure 4:
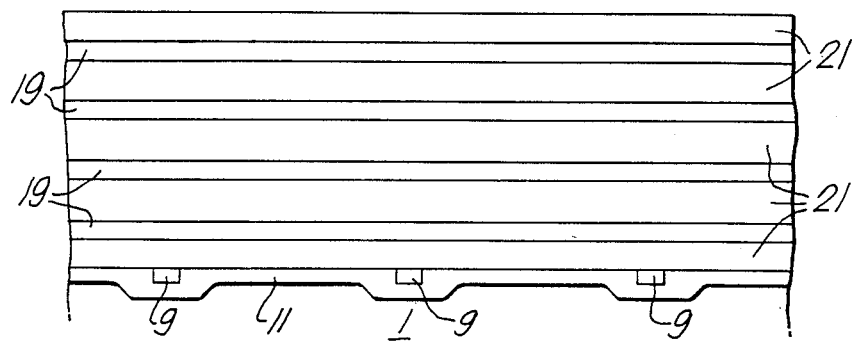
FIGS. 4, 5 and 6 illustrate stages in the manufacture of the device.

Referring to FIG. 1, the device is formed on a silicon substrate 1. On one of its main faces the substrate carries a body of an electronic storage material in the form of a layer 3 of silicon oxide in which are formed silicon islands 5. The islands 5 are disposed in a rectangular matrix of columns extending in a direction normal to the storage material/substrate interface 7, each column being shown in the drawing as comprising four islands, although typically this will be more, e.g. equal to the number of bits in a byte to be stored in the device. As will be further explained below, each island constitutes an electric charge storage site in the layer 3.

Referring now also to FIG. 2, in the substrate 1, adjacent the interface 7, there is formed a number of spaced strip-form $p^{30}$ regions 9 and a number of spaced strip-form $n^+$ regions 11 which extend at right angles to the $p^+$ regions, thereby to provide a respective p-n junction adjacent the end island of each column of islands 5, the $p^+$ region 9 of each junction being nearer the layer 3.

On the face of the layer 3 remote from the substrate there is provided a layer of monocrystalline silicon 13 in which is formed an integrated circuit. As hereinafter described in greater detail, the integrated circuit operates in association with the regions 9 and 11 to inject electric charge into the island 5 adjacent the substrate 1 of any selected column of islands, and effect transfer of each of the charges in a selected column of islands to the next adjacent island in that column in a direction towards the integrated circuit. Thus each column of islands serves as a discrete n-bit memory element of the shift register type accessed by the integrated circuit, n being the number of islands in a column.

The integrated circuit may be manfactured using known integrated circuit techniques to be of any desired appropriate form, and details of the integrated circuit are therefore not shown in the drawing. However, it will be appreciated that the integrated circuit will necessarily include a respective element, e.g. a transistor, one for each column of island, into which charge from the end island of the associated column may be transferred.

Injection of electric charge is effected in operation by causing avalanche breakdown of the p-n junction associated with the column of islands in which data is to be stored, the data normally being binary data and a '1' and '0' being respectively represented by the presence and absence of stored change in an island.

Normally the substrate of the integrated circuit will be at ground potential in which case breakdown of the required p-n junction is suitably effected by applying a positive potential, e.g. 5 volts to the appropriate $n^+$ strip 11 and a relatively high negative potential, e.g. $-15$ volts, to the appropriate $p^+$ region strip 9.

Transfer of charge from one island 5 in a column to the next island in a direction towards the integrated circuit is effected by applying a negative potential to the associated p+ region 9, without an accompanying positive voltage on the associated n+ region 11.

Transfer of charge from the end island in a column to the associated integrated circuit element is effected in similar manner.

The mechanism of transfer from one island to another, or to the integrated, is first by Fowler-Nordheim tunnelling of electrons from the island into the conduction band of the oxide, and then by transport through the oxide to the next island or the integrated circuit.

To avoid pile up of charge in a column the time of transport through the oxide is made greater than the time for the majority of charge in an island to tunnel out of an island into the oxide, and to effect transfer a voltage pulse of the form illustrated in FIG. 3 is applied to the relevant p+ region. The relatively high amplitude relatively short leading portion 15 of the pulse gets the charge into the oxide and the smaller amplitude longer remaining portion 17 of the pulse produces the required charge transport to the next island, without any possibility of the charge tunnelling out of the next island until a further transfer pulse is applied.

It will be appreciated that in the particular device described above with reference to FIGS. 1 and 2, although individual columns may be accessed for charge injection, all the columns associated with a single p+ region are necessarily accessed for charge transfer simultaneously. However it will be appreciated that in alternative devices in accordance with the invention, the integrated circuit and associated control means may be arranged to access the columns individually for both charge injection and transfer.

In a modification of the device described above with reference to FIGS. 1 and 2, the islands are illuminated through the integrated circuit to give photon-assisted tunnelling. However, the light used must have an energy less than the silicon band gap to avoid disturbing the integrated circuitry. To prevent unwanted breakdown and resulting charge injection by the p-n junctions between regions 9 and 11 due to the illumination, the light may be projected through a suitable grid to restrict light to the regions of the columns only and the p-n junctions positioned to one side of the columns.

Alternatively, to improve charge mobility in the silicon oxide and hence rate of charge transfer, a high concentration of silicon or other impurity may be introduced into the oxide, i.e. by ion implantation, to give an impurity band and therefore a smaller band gap.

A suitable method of manufacture of the device shown in FIGS. 1 and 2 will now be described with reference to FIGS. 4 to 6.

First, the p+ and n+ regions 9 and 11 are formed in one face of the silicon substrate 1, using any convenient known impurity diffusion or implantation technique.

Referring to FIG. 4, alternate layers 19 and 21 of silicon and silicon oxide, respectively, are then formed on the substrate overlying the respective p+ and n+ regions 9 and 11. This may be done by alternate epitaxial growth of silicon and oxide layers or by epitaxial growth of a silicon layer, partial oxidisation of the silicon layer, growth of a further silicon layer followed by partial oxidisation, and so on.

Figure 5:
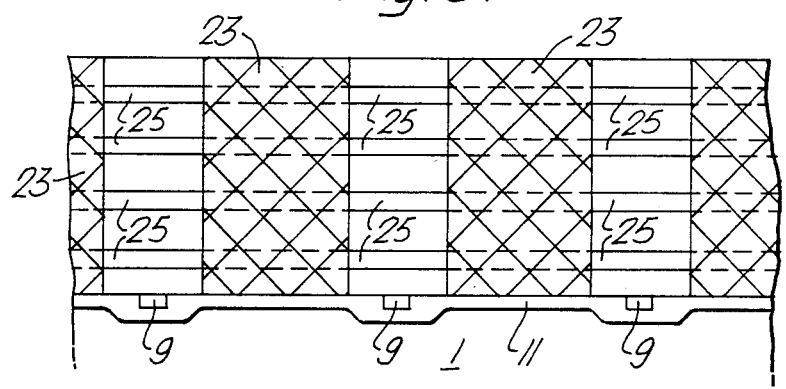
Figure 6:
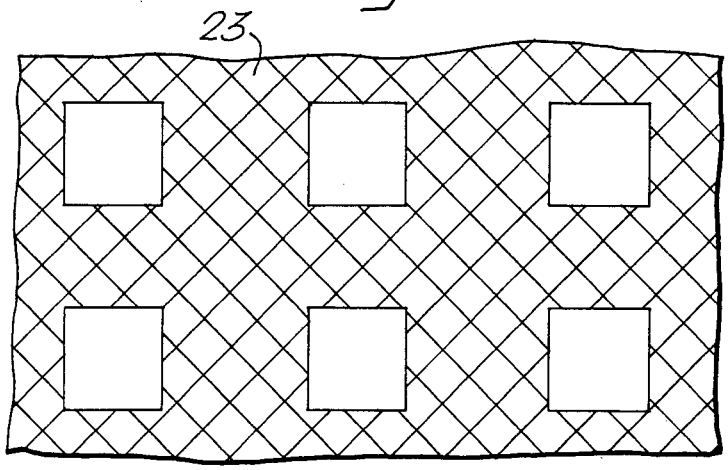

Referring now to FIGS. 5 and 6 (FIG. 6 being a plan view of the structure of FIG. 5) oxygen is then implanted into the Si/So$_2$ layer structure in a rectangular grid pattern 23 positioned appropriately with respect to the underlying p-n junctions between regions 9 and 11, and the assembly heated to oxidise all the silicon into which oxygen has been implanted. The remaining parts 25 of the silicon layers 19 then constitute columns of silicon islands separated by silicon oxide, as required.

Finally, a monocrystalline layer of silicon is formed on the exposed surface of the layer structure, for example, by recrystallisation of a deposited polysilicon layer, and the required integrated circuit formed in the monocrystalline silicon layer using known techniques.

It will be appreciated that whilst in the embodiment of the invention described above, by way of example, the body of storage material consists of silicon, this is not necessarily the case. Thus the body of storage material may be any material capable of storing electric charge at discrete locations therein and allowing transport of charge from one location to another.

Many organic materials having properties which allow them to be fabricated into a multi-layer structure, for example, by the Langmuir-Blodgett technique, and permit the storage and transfer of charge from layer to layer by mechanisms similar to those described above are likely to be suitable for use as the storage material in a device according to the present invention.

I claim:

1. A data storage device associated with a planar integrated circuit, the storage device comprising:
   (a) a body of discrete electric charge storage material formed on a face of said planar integrated circuit;
   (b) within said body, a plurality of spaced discrete columns of spaced discrete electric charge storage sites, the columns extending in directions normal to the plane of said planar integrated circuit and;
   (c) control means on the side of said body remote from said integrated circuit, said control means being connected with said integrated circuit such that, under the control of potentials applied to said control means by said integrated circuit, electric charge may be injected into a said storage site adjacent said control means in a selected said column, and such that each charge in a storage site in a selected said column may be transferred to the next adjacent site in the column in a direction towards the integrated circuit, and in the case of a charge in the storage site of said selected column adjacent said integrated circuit, be transferred to an element of said integrated circuit, thereby to provide access to said storage sites.

2. A device according to claim 1 wherein said body of storage material consists of semiconductor material, each storage site consisting of a material of relatively low dielectric constant compared with the material separating said sites.

3. A device according to claim 2 wherein the storage sites consist of silicon and the material separating the sites consists at least primarily of silicon oxide.

4. A device according to claim 1 wherein said control means comprises a respective p-n junction adjacent that end of each column of storage sites which is remote from said integrated circuit, each said p-n junction being arranged to inject charge into the adjacent storage site by an avalanche breakdown mechanism.

* * * * *